Nov. 9, 1965 J. T. BECK 3,217,089
EMBEDDED PRINTED CIRCUIT
Filed June 1, 1962 2 Sheets-Sheet 1
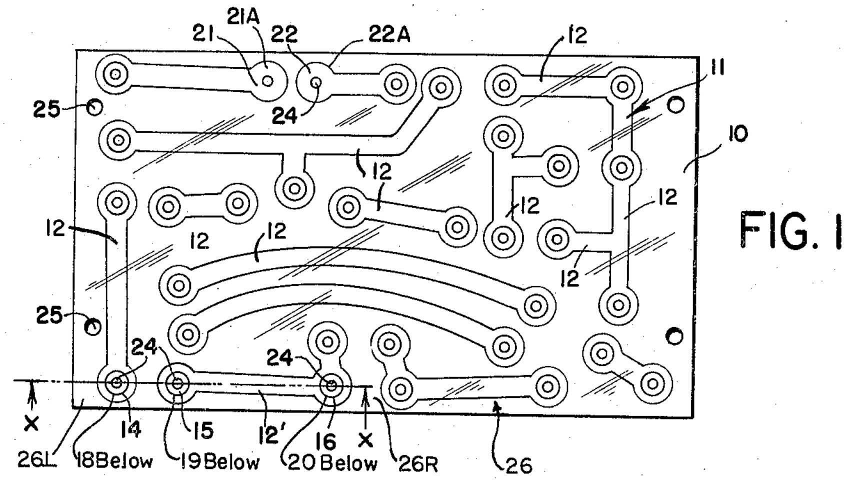
FIG. I
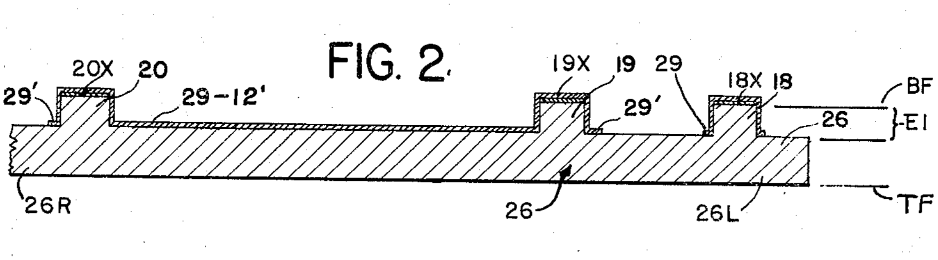
FIG. 2.
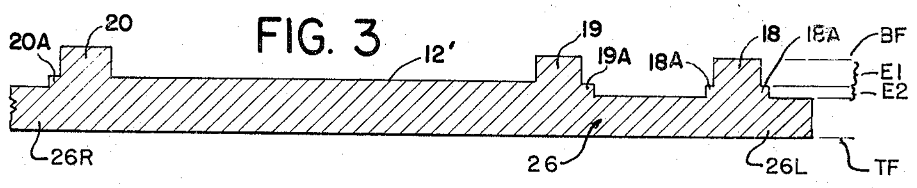
FIG. 3
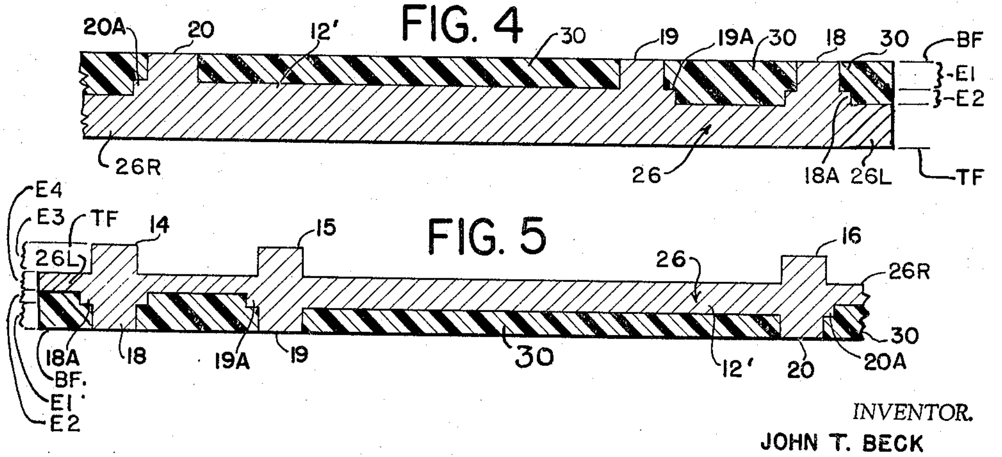
FIG. 4, FIG. 5
INVENTOR.
JOHN T. BECK
BY
Dugger & Johnson
ATTORNEYS Nov. 9, 1965 J. T. BECK 3,217,089

EMBEDDED PRINTED CIRCUIT

Filed June 1, 1962

2 Sheets-Sheet 2

INVENTOR.
JOHN T. BECK

BY Dugger & Johnson

ATTORNEYS

United States Patent Office 3,217,089
Patented Nov. 9, 1965

3,217,089
EMBEDDED PRINTED CIRCUIT
John T. Beck, White Bear Lake, Minn., assignor, by mesne assignments, to Control Data Corporation, Minneapolis, Minn., a corporation of Minnesota
Filed June 1, 1962, Ser. No. 199,335
5 Claims. (Cl. 174—68.5)

Figures 6, 7, 8, 9, 10, 11, 12:
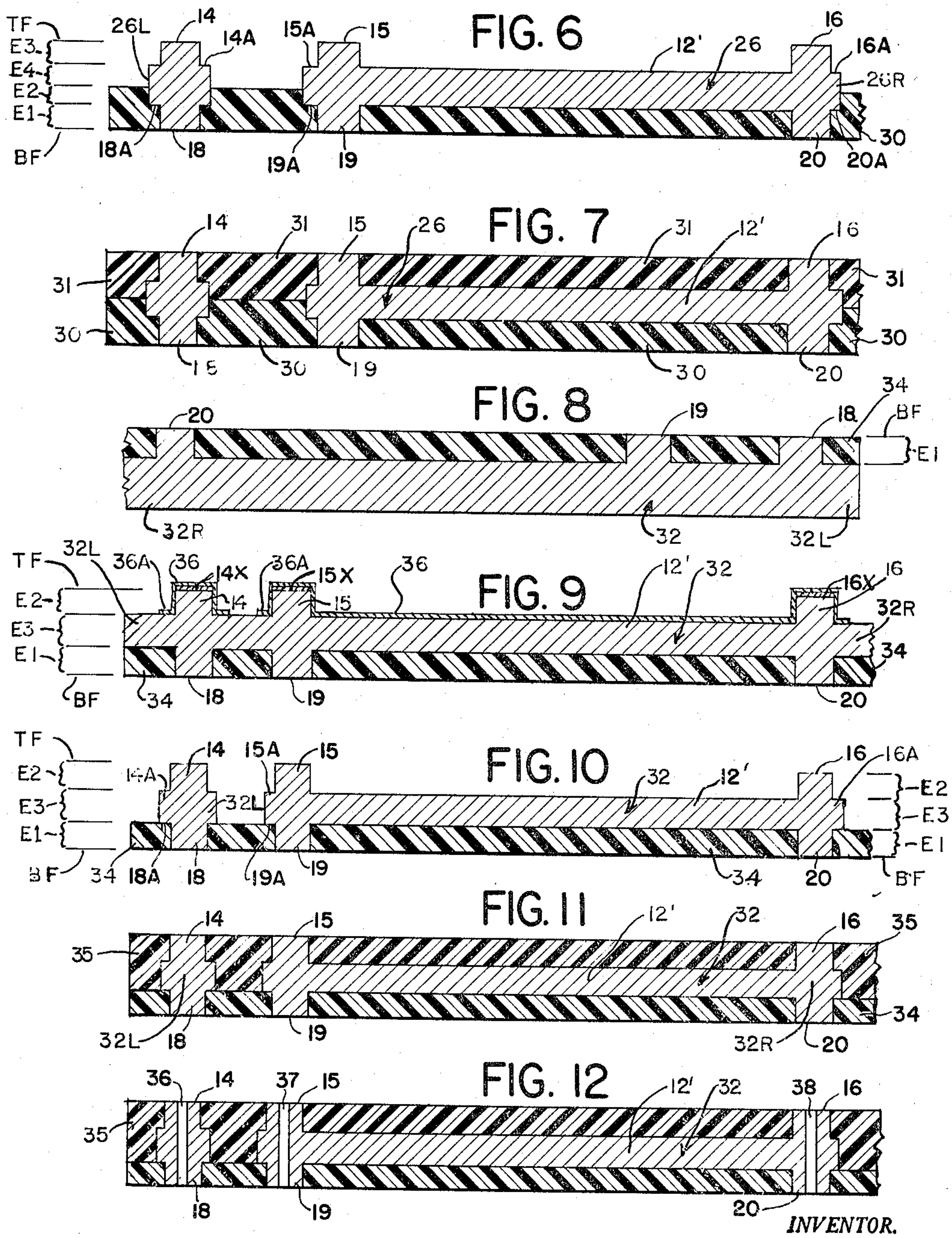

This invention relates to electrical circuit components and methods of preparing them. Especially the invention concerns components in which strips of conductive metal, aligned and arranged in a circuit pattern and having terminals thereon are embedded in insulating material to completely encase the circuit portions and leave the terminals exposed. Various constructions permitting electrical contact with the embedded circuit from outside the insulating material are provided as needed. These may include terminal switch surfaces, sliding contact terminals, etc. According to the present invention, contacts integral with the circuits can be provided on either face (top or bottom) of the circuitry unit and integral through terminals of original metal, extending through the finished circuit board and exactly aligned on opposite sides, can be provided. An embedded circuit is more durable than other forms of printed circuits and permits more reliable connections with circuit components such as resistors, transistors, etc.

Embedded circuits are less susceptible to flash-over than surface circuitry. A circuit embedded in a casing of cured insulation material creates a dependable unit adaptable to many uses. One such use is to assemble several units into a larger more complex structure. For example, several planar circuit elements can be assembled as layers in a "stacked" or face-to-face relationship to create complex circuitry. Through terminals of one such unit can be spot welded through terminals of an adjacent unit. Such circuitry is used in computers, missiles and satellites. Other "layer-built" units are used in switching mechanisms.

It is an object of this invention to construct a durable circuit component having an embedded circuit with exposed terminal contacts, etc. provided and adapted to permit a more secure connection with leads from circuit elements.

It is a further object of this invention to construct a durable circuit component having embedded circuits and integral aligned through-terminals exposed on one or both sides of the component.

It is a further object of this invention to construct a circuit component having a firmly embedded circuit in insulating material with terminals adapted to permit the use of the component in layer type circuitry and to permit a permanent welded connection between the terminals and leads attached to them.

Other and further objects are those inherent in the invention herein illustrated, described and claimed and will be apparent as the description proceeds.

To the accomplishment of the foregoing and related ends, this invention then comprises the features hereinafter fully described and particularly pointed out in the claims, the following description setting forth in detail certain illustrative embodiments of the invention, these being indicative, however, of but a few of the various ways in which the principles of the invention may be employed.

FIGURE 1 is a plan view of an illustrative circuit component formed according to the invention;

FIGURES 2 through 7 illustrate one method of the present invention for making circuitry as shown in FIGURE 1. FIGURE 2 is taken in the direction of arrows X—X of FIGURE 1 and inverted by rotating it 180° in a clockwise direction. FIGURE 2 is rotated end-for-end as compared to FIGURES 3–7. FIGURE 2 illustrates the first several steps in the process. FIGURES 3 through 7 are sectional views of the circuitry, taken in the direction of arrows X—X of FIGURE 1, and illustrate various subsequent steps in the process of producing the circuitry shown in FIGURE 1.

FIGURES 8–12 illustrate an alternative method of producing the circuitry shown in FIGURE 1. FIGURE 8 (like FIGURE 2) is taken in the direction of arrows X—X of FIGURE 1 and is then rotated 180° clockwise end-for-end, and is therefore inverted as compared to FIGURES 9–12. FIGURE 8 illustrates the first several steps in the method. FIGURES 9–12 illustrate subsequent steps in the method.

Throughout the drawings, corresponding numerals refer to the same parts.

According to the present invention, the production of the circuitry begins with a sheet or plate of conductive metal or any other metal that is desired to be made into circuitry. Thus, the sheet metal may be of copper, silver, gold, brass, stainless steel, or other metals or alloys may be used depending upon the characteristics of the circuitry desired to be produced. Referring to FIGURES 2–7 specifically, the process starts with a sheet of metal 26. There is first placed upon the lower face of the metal 26 a pattern of resist lacquer, capable of resisting an etching bath. The pattern of resist lacquer covers only those areas which are ultimately to be exposed through the plastic embedment of the bottom face of the finished circuitry shown in FIGURE 1. In the illustrated form of circuitry shown in FIGURES 2–12, these areas are the terminals 18, 19 and 20. These are the terminals which are on the bottom face of the sheet shown in FIGURE 1, being the terminals immediately below the terminals 14, 15 and 16 respectively, which are on the top face of the circuitry. To form these terminals, spots of "resist" (lacquer) are thus placed at a pluraltiy of round dots or other shaped areas on the lower face of the metal sheet 26, as for example at 18X, 19X and 20X, as shown in FIGURE 2. The resist may be placed by photo electric methods, in which case it is called a "photo resist" or it may be replaced by silk screen or in any other manner. The top face TF of the sheet 26 of metal (shown at the bottom in FIGURES 2, 3 and 4) and its edges are also suitably protected by etching resist lacquer and the sheet is then placed in the etching bath, and as consequence, metal will be removed from the level of line BF (bottom face) to the depth indicated by bracket E1. This first etching is indicated by the bracket E1. As a consequence, on the lower face of the sheet 26 (which is upwards in FIGURE 2) there will then appear small pillars or islands forming ultimately the terminal posts 18, 19 and 20. These protrude above the level of the surface of the sheet as etched in the first etching E1.

Then a further pattern of etching resisting lacquer 29 is placed on the lower surface of the sheet as also shown in FIGURE 2. This lacquer covers the previous layers of lacquer at 18X, 19X and 20X, and also covers the sides of the upwardly protruding terminals 18, 19 and 20, and also such areas as at 29' around the base of the terminal pillars 18, 19 and 20. This pattern of "resist" lacquer also covers those parts of the sheet which will ultimately form the connecting lines as at 29–12', corresponding to the circuit portion 12' shown in FIGURE 1. The remaining portions of the lower surface (BF; bottom face) of the already once-etched sheet are exposed, and the sheet 26 is then subjected to a second etching, which reduces the thickness of the sheet 26 by a somewhat smaller distance such as indicated opposite the bracket 2 in FIGURE 3. As a result of this etching, it will be noted that around each of the pillars 18, 19 and 20, which form terminals, there is an enlargement or collar at 18A, 19A and 20A, and between such terminals as are intended to be connected, there is a land of metal as at 12' in FIGURE 3. The lacquer "resist" is then removed by suitable solvent washings and the resultant etched metal is then as shown in FIGURE 3.

The resultant twice-etched sheet as shown in FIGURE 3 is then filled with electrical insulating plastic as shown in FIGURE 4. Thus, the plastic 30 is filled into all of those voids in the lower surface of the sheet 26 which resulted from the removal of meal by the etching steps E1 and E2 so as to bring the level of the plastic up to the original level BF of the sheet 26; that is to say flush with the top of the terminal pillars 18, 19 and 20. The sheet 26 is then turned over (so as to bring the left end 26L of FIGURES 2, 3, and 4 over to the left side and to bring the right end 26R over to the right side). In FIGURES 2, 3 and 4, the left and right ends were reversed, end-to-end so as to bring the lower surface BF of the sheet 26 to the upper side.

In FIGURE 5, there is illustrated the composite as it appears after the third etching, which is to say the first etching on the top face TF of the sheet. To produce this, there are placed on the top of the sheet 26 a pattern of areas of etching resistant lacquer or "resist" appropriately located so as to be in registry with such of the terminal desired to be produced. In this illustration which especially shows "through-terminals," the registry is such that the spots of "resist" placed on the upper face of the sheet in preparation for etch E3 will be exactly aligned over the already formed terminal pillars 18, 19 and 20. These, as shown in FIGURE 5, the terminals 14–18 and 15–19 and 16–20 are "through-terminals." In other words, they reach through one face of the circuitry to the opposite face of the circuitry, and therefore the pattern of etching resistant lacquer spots which are placed upon the top face TF of the sheet 26 preparatory to making the third etch E3, which results in a configuration of FIGURE 5, these etching resistant spots are placed directly in registry, but on the opposite face of the sheet 26 in respect to the terminals 18, 19 and 20. The lower face sheet is at this time completely protected by the plastic filling 30 on the lower facing of the sheet, and a suitable resist such as a resistant lacquer is preferably placed entirely over this plastic and terminals 18, 19 and 20 and on the edge of the sheet, and wherever protection from etching is desired. As a result of the third etch E3, metal is reduced from the top face TF of the sheet to a depth as shown opposite the bracket E3 in FIGURE 5, thus leaving pillars of metal at 14, 15 and 16 aligned with the terminal pillars 18, 19 and 20 of the bottom face of the sheet.

Then a further layer of etching resistant lacquer or "resist" as corresponding to FIGURE 2 to the areas 29', 29–12', etc., and 29, over the pillars 14, 15 and 16 and around their bases and where the leads, such as lead 12' is desired to be formed. Then the sheet 26 of metal is subjected to the fourth etch, E4, and this accordingly removes all metal not covered, thereby isolating the terminals and circuitry strips according to the pattern shown in FIGURE 6. It will be noted that around the terminal 14 at the base there is produced enlargement 14A and similar enlargements are provided at 15A around the terminal 15 and at 16A around terminal 16. In addition, the metal at 12' between the terminals 15 and 16 is not removed since it was covered by lacquer, consequently leaving a thickened connection portion 12' as shown in FIGURE 6. The isolated portions of circuitry (example terminal 14–18; terminal 15–19 line 12' and terminal 16–20) thus produced, are held together by the plastic 30 which at this stage of the process forms the carrier on which the circuit terminals, strips and areas, which are the residue of the original sheet 26 (which has not been etched away), are held in the precise configuration in which they will be in the finished device.

After thoroughly removing the etching resist lacquer from all surfaces of the top and bottom faces of the sheet 26 to which it has been applied, there is then placed on the top surface of the sheet a filling of plastic 31, which meets with the plastic 30 in all areas where there are not elements of circuitry. The plastic 31 covers all connecting lines of circuitry as at 12' and completely embeds the enlargements 14A, 15A and 16A (see FIGURE 6). The filling of plastic 31 is brought up to the original line TF of the top face of the sheet 26, which is to say to the top of the terminals 14, 15 and 16, and both layers of plastic 30 and 31 are then completely cured, thereby producing an integral embedement wherein the layers of plastic 30 and 31 are bonded together as a unitary whole and completely encased the terminals and circuit line of the circuitry.

It will be noted that where the terminals are formed opposite each other, as for example terminal 14 is opposite terminal 18, and terminal 15 is opposite terminal 19, these terminals extend straight through and are integral, being the residue of the sheet itself, and consequently a welding force is placed (and through current to produce heat) upon one such terminal surface, such as surface of terminal 14, will be transferred through the column of the metal composed at terminals 14–18 to the surface of terminal 18, and if another terminal is abutted against it in a stack, it can be welded thereto, thereby forming "stacked-circuitry" with terminals of one circuitry panel welded directly to the circuitry of a contiguous metal.

According to the method illustrated in FIGURES 2–7, there are four etchings. The amount of metal removed by these etchings can be varied, and need not be precisely controlled. The first etching at E1 should normally remove say from 20% to 35% of the total thickness of the metal. Similarly, the third etching, E3, would remove a like amount of metal. The balance of the thickness of the metal is removed by the two etchings E2 and E4 in approximately equal amounts. Thus, if the first etching E1, and the third etching E3 each removed 30% of the thickness of the original sheet 26, the remaining 40% of the thickness would be removed in two etchings of 20% each for the etchings E2 and E4. The amounts removed will depend upon how thick it is desired to leave the circuitry lines 12' in relation to the original thickness of the metal and how much plastic insulation cover is desired over the circuit lines, as at 12'. Enough metal is removed by the original etching E1 and subsequent etching E2 so as to provide at least enough thickness of plastic 26 to give a solid support for the isolated circuit components later formed in the process, since it is this plastic layer which supports the circuitry components during the etchings E3 and E4, particularly at the end of the E4 etching, where all of the terminals and circuitry lines are separated from each other and are only supported by the plastic layer 30.

The kind and type of plastics which are used may be widely varied. They may be thermosetting or "cold-setting," i.e. self-hardening resins and may be hardened either with or without heat and pressure. Epoxy resins are very satisfactory, but other plastic materials such as phenolics, urea-formaldahyde resin, melamine resin, furan resin, tetrafluoroethylene (Teflon), and polyethylene terephthalate (Mylar) resin may be used. The resinous materials may be reinforced by electrically non-conductive paper, fiber, glass and similar materials, and electrically non-conductive fillers may be added where desired. The resinous materials may be self-curing or may be cured with heat and pressure, and curing may be carried out between platens or by oven curing.

The resinous materials in many instances are clear plastics or at least translucent, and the circuitry lines, such as those shown at 12 in FIGURE 1 are visible or at least slightly visible when the composite is held up to light. FIGURE 1 is intended to illustrate a component wherein the plastic is clear or translucent. The terminal areas such as 14, 15 and 16 are the only areas actually exposed on the surface, whereas the enlargements at the bases of these terminals and the circuit lines as at 12' along section line X—X, are visible through the plastic being embeded below the surface of plastic.

FIGURES 8, 9, 10, 11 and 12 illustrate another process wherein the number of etchings is reduced to a total of only three etchings. According to this method, a sheet 32 of metal, of which the circuitry is to be formed, is first provided with a pattern of lacquer resist over those areas forming terminals 18, 19 and 20 of FIGURE 8, and (with the entire reverse side of the sheet protected by resist lacquer) the metal is then placed in an etching bath and the metal reduced by etching to a depth as shown opposite the bracket E1 of FIGURE 8. The resist lacquer is then washed away so as to leave clean metal, and the bottom face of the sheet which is shown upwardly in FIGURE 8 is then filled with plastic material 34 to a depth up to the original line BF forming the bottom face of the sheet 32. This resin is then cured or partially cured. The sheet is then turned over (end-for-end as shown in FIGURES 9–12 as compared to FIGURE 8) and other areas of photo resist lacquer such as those at 14X, 15X and 16X are then applied. At this time of course, the lacquer layers 36, 36A for the third etching are not in place. With only the terminal spot 14X, 15X and 16X (and any other areas which are desired to be exposed on the top face TF of the sheet) and the whole bottom face, covered by a resist lacquer, the sheet is then submerged and subjected to the second etching, and metal is removed to a depth as shown oposite the bracket E2. This leaves protruding terminals 14, 15 and 16. Next, a layer of etching resist lacquer is then placed as at 36 and 36A, covering all areas which are desired as enlargements at the base of the terminals and all areas which are desired as connections between terminals and the reverse side of the composite. The composite is then subjected to the third etching E3, which removes all of the remaining or exposed metal down to the back surface (top surface of the plastic 34 in FIGURE 10) is then removed and the result composite is as shown in FIGURE 10 wherein the terminals 14–18 with the enlargement at 14A, and terminals 15–19 with the enlargement 15A connected by the lead line 12′ of the terminal 16–20 of the enlargement 16A are formed, and these are held together since terminals 18, 19 and 20 are embedded in the plastic layer 32.

The top face TF of the sheet is then filled with plastic 35, which fills all of the surface from the back side (upper side as shown in FIGURES 10, 11 and 12) of the lower plastic layer 34 on up to the top of the terminals 14, 15 and 16, i.e., up to the original layer TF of the upper face of the metal sheet 32. The plastic fillings 34 and 35 bond together and completely embed all of the terminals and lead lines, leaving exposed only those areas at the top of the terminals 14, 15 and 16, and the top of the terminals 18, 19 and 20, and such other terminals that are desired.

FIGURE 12 illustrates the manner in which holes 36, 3 and 38 may be drilled in terminals 14, 15 and 16 respectively for insertion of leads, or by any other purpose.

In the process herein which involves four etchings, E1 through E4, some saving in time and material is accomplished by carrying out the etchings E1 and E3 simultaneously. Thus, patterns of resist appropriate to the terminals and other areas on the top face TF and bottom face BF of the metal sheet are covered with resist lacquer and the metal sheet is then etched. The resist is then applied to one entire face, as the thus partially etched top face TF and etch E2 is proceeded with, as before on the bottom face to form the lands around the terminal pillars and partially form the circuitry. Then plastic is filled on the face thus twice etched, and the resist removed from the entire other face and then replaced on those selected areas, as for example etch E4, which complete the circuitry. The resist is then removed and the second plastic filling is applied and the unit completed as described.

As many apparently widely different embodiments of the invention may be made without departing from the spirit and scope thereof, it is to be understood that I do not limit myself to the specific embodiments disclosed herein.

What I claim is:

1. A printed circuit comprising a unitary panel having a plurality of electric printed circuit conductors located in a relatively thin circumfused body of insulating material having parallel planar surfaces, said body comprising a plurality of layers of insulating material having fused interfaces, each of said conductors being substantially in the same plane and of generally rectangular cross-section and having a top and bottom surface and side edges, at least some portions of said conductors of said unitary panel being disposed in non-parallel relationship in respect to other portions of conductors of said panel, integral terminals extending from the top and bottom surfaces of said condutcors, said terminals extending to said planar surfaces on opposite sides of said circumfused body, the top and bottom surfaces and edge surfaces of the conductors and the side edges of the terminals having rough textured surfaces.

2. A printed circuit comprising a unitary panel having electric printed circuit conductors extending in various predetermined directions so as to define an electric circuit, at least some portions of said conductors of said unitary panel being disposed in non-parallel relationship in respect to other portions of condutcors of said panel, integral terminals extending from the top and bottom surfaces of said condutcors, all of the conductors being in substantially the same plane and in a relatively thin circumfused body of insulating material having parallel planar surfaces, said body comprising a plurality of layers of insulating material having fused interfaces and said conductors having a substantially rectangular cross-section defined by top and bottom generally planar surfaces and side edges, said terminals extending from the conductors top and bottom surfaces to said planar surfaces at each side of said circumfused body, said condutcors being enlarged around the base of each terminal and providing a flange around the base of the terminal, the sides of the terminals and the flanges and all services of the conductors having rough textured surfaces.

3. A submerged printed circuit as specified in claim 2 further characterized in that said insulating material is a plastic.

4. A submerged printed circuit as specified in claim 2 further characterized in that said conductors are located in a central locating plane in said body of insulating material.

5. A submerged printed circuit as specified in claim 2 further characterized in that there are two layers of said insulating material.

References Cited by the Examiner

UNITED STATES PATENTS

| | | | |
|---|---|---|---|
| 2,889,532 | 6/59 | Slack. | |
| 2,964,436 | 12/60 | Mikulis et al. | 156—3 |
| 3,007,997 | 11/61 | Panariti | 174—68.5 |
| 3,010,863 | 11/61 | Coe et al. | 156—3 |
| 3,019,283 | 1/62 | Little | 174—68.5 |
| 3,040,213 | 6/62 | Byer et al. | 317—101 |

DARRELL L. CLAY, *Primary Examiner.*

JOHN P. WILDMAN, E. JAMES SAX, *Examiners.*